(12) United States Patent
Campbell et al.

(10) Patent No.: US 9,504,189 B1
(45) Date of Patent: Nov. 22, 2016

(54) THERMOELECTRIC-ENHANCED, INLET AIR-COOLED THERMAL CONDUCTORS

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/824,401

(22) Filed: Aug. 12, 2015

(51) Int. Cl.
*H05K 7/20* (2006.01)
*F25B 21/02* (2006.01)

(52) U.S. Cl.
CPC ........... *H05K 7/20754* (2013.01); *F25B 21/02* (2013.01); *H05K 7/20127* (2013.01); *H05K 7/20436* (2013.01); *H05K 7/20545* (2013.01)

(58) Field of Classification Search
CPC .................... H05K 7/20754; H05K 7/20436; H05K 7/20127; H05K 7/20545; H05K 7/20154; H05K 7/20163; H05K 7/2039; H05K 7/20409; H05K 7/20418; H05K 7/20427; H05K 7/20445; H05K 7/20454; H05K 7/20463; H05K 7/20472; H05K 7/20481; H05K 7/2049; H05K 7/205; H05K 7/20509; H05K 7/20518; H05K 7/20854; H05K 7/20863; H05K 7/209; H05K 7/20909; H05K 7/20963; H05K 7/20972; F25B 21/02; G06F 1/20; G06F 1/203; G06F 2200/201; G06F 2200/203; H01L 23/36; H01L 23/367; H01L 23/3672; H01L 23/3675; H01L 23/3677; H01L 23/40; H01L 23/4006
USPC ........................ 361/679.46–679.54, 688–723; 454/184–186, 188–193, 228–368
See application file for complete search history.

(56) References Cited

U.S. PATENT DOCUMENTS 6,557,354 B1 * 5/2003 Chu ........................ H01L 35/30
62/259.2
6,650,536 B2 * 11/2003 Lee ........................... G06F 1/20
165/104.21
(Continued)

FOREIGN PATENT DOCUMENTS

CN 102130076 B 5/2012
JP 2006-228868 A 8/2006
(Continued)

OTHER PUBLICATIONS

Campbell et al., "Thermoelectric-Enhanced, Inlet Air-Cooled Thermal Conductors", U.S. Appl. No. 14/922,324, filed Oct. 26, 2015 (44 pages).
(Continued)

*Primary Examiner* — Anthony Haughton
*Assistant Examiner* — Yahya Ahmad
(74) *Attorney, Agent, or Firm* — Steven Chiu, Esq.; Kevin P. Radigan, Esq.; Heslin Rothenberg Farley & Mesiti P.C.

(57) ABSTRACT

A cooling apparatus is provided, which includes: a thermal conductor to cool a heat-dissipating component(s) of an electronics enclosure, the enclosure including an air inlet side through which airflow ingresses. The thermal conductor includes a first conductor portion coupled to the heat-dissipating component(s), and a second conductor portion positioned along the enclosure's air inlet side. The apparatus further includes one or more air-cooled heat sinks coupled to the second conductor portion to facilitate transfer of heat from the second conductor portion to the airflow ingressing into the enclosure, and one or more thermoelectric devices coupled to at least one of the first or second conductor portions to selectively provide auxiliary cooling. A controller controls operation of the thermoelectric device(s) and selectively switches operation of the cooling apparatus between an active cooling mode, where the thermoelectric device(s) is active, and a passive cooling mode, where the thermoelectric device is inactive.

19 Claims, 13 Drawing Sheets

(56) References Cited

U.S. PATENT DOCUMENTS

| | | | |
|---|---|---|---|
| 6,819,563 B1* | 11/2004 | Chu | G11B 33/1406 165/104.33 |
| 7,212,403 B2 | 5/2007 | Rockenfeller | |
| 7,227,749 B2 | 6/2007 | Rockenfeller | |
| 7,235,406 B1 | 6/2007 | Woudenberg et al. | |
| 7,492,593 B2 | 2/2009 | Campbell et al. | |
| 7,688,584 B1 | 3/2010 | Beckin | |
| 7,950,244 B2 | 5/2011 | Iyengar et al. | |
| 8,248,801 B2* | 8/2012 | Campbell | H05K 7/2079 165/104.33 |
| 8,925,333 B2 | 1/2015 | Campbell et al. | |
| 8,955,347 B2 | 2/2015 | Campbell et al. | |
| 2002/0063327 A1* | 5/2002 | Chu | H01L 23/34 257/706 |
| 2004/0100770 A1* | 5/2004 | Chu | H05K 7/20754 361/698 |
| 2005/0061013 A1 | 3/2005 | Bond | |
| 2006/0227504 A1* | 10/2006 | Chen | H01L 23/467 361/679.47 |
| 2009/0225514 A1 | 9/2009 | Correa et al. | |
| 2012/0024501 A1* | 2/2012 | Campbell | H05K 7/2079 165/104.33 |
| 2012/0111027 A1* | 5/2012 | Campbell | F25B 21/02 62/3.3 |
| 2012/0111028 A1* | 5/2012 | Campbell | F25B 40/00 62/3.7 |
| 2012/0186790 A1 | 7/2012 | Delia et al. | |
| 2012/0211204 A1* | 8/2012 | Agonafer | H01L 23/473 165/104.31 |
| 2012/0279233 A1* | 11/2012 | Chainer | H05K 7/20781 62/3.6 |
| 2013/0091868 A1* | 4/2013 | Campbell | F25B 21/02 62/3.2 |
| 2014/0133098 A1 | 5/2014 | Campbell et al. | |
| 2015/0059358 A1* | 3/2015 | Chang | F25B 21/02 62/3.2 |

FOREIGN PATENT DOCUMENTS

| | | |
|---|---|---|
| JP | 2013-258166 A | 12/2013 |
| KR | 10-2009-0024413 A | 3/2009 |
| KR | 10-0918315 B1 | 9/2009 |

OTHER PUBLICATIONS

Campbell et al., "Thermoelectric-Enhanced, Inlet Air Cooling for an Electronics Rack", U.S. Appl. No. 14/791,681, filed Jul. 6, 2015 (45 pages).

Dampbell et al., "Thermoelectric-Enhanced, Inlet Air Cooling for an Electronics Rack", U.S. Appl. No. 14/870,297, filed Sep. 30, 2015 (39 pages).

Marshall et al., "Modeling Alternative Cooling Concepts in CoolSim", White Paper No. 110, Applied Math Modeling Inc., Concord, NH (USA), Jul. 2011 (8 pages).

Moss, David L., "Top 10 Reasons to Consider Dell PowerEdge Energy Smart Containment Rack Enclosures", White Japer, Dell, Inc., Version 1.0, Apr. 2013 (11 pages).

Emerson Product Brochure, "Liebert DCD Rack Door Cooling Module—Chilled Water-Based, Fanless Rack Door cooling Module", 2011 (No further date information is available) (2 pages).

Campbell et al., "List of IBM patents and/or Patent Applications Treated as Related", U.S. Appl. No. 14/824,401, filed Aug. 12, 2015, dated Mar. 16, 2016 (2 pages).

"Ferrotec Thermoelectric Modules—Peltier Cooler Model 9504/071/150 B", FerroTec website product page (1 page) (No additional date information available.).

* cited by examiner

THERMOELECTRIC-ENHANCED, INLET AIR-COOLED THERMAL CONDUCTORS

BACKGROUND

The power dissipation of many computer system components continues to increase in order to achieve increases in performance. This trend poses a cooling challenge at both the component and system levels. Increased airflow rates are needed to effectively cool higher-power components, and to limit the temperature of the air that is exhausted into, for instance, a computer center.

In many large server applications, processors, along with their associated electronics (e.g., memory, disk drives, power supplies, etc.), are packaged in removable system configurations and assembled within an electronics (or IT) rack or frame. In other cases, the electronics may be in fixed locations within the rack or frame. Typically, the heat-generating components within an electronic system are cooled by air moving in airflow paths impelled by one or more air-moving devices (e.g., axial or centrifugal fans). In some cases, it may be possible to handle increased power dissipation within a system or rack by providing greater airflow through the use of a more powerful air-moving device, or by increasing the rotational speed (RPMs) of an existing air-moving device. However, this approach may be problematic at the component level dependent, in part, on system layout, and the inlet air temperature.

BRIEF SUMMARY

In one or more aspects, the shortcomings of the prior art are overcome and additional advantages are provided through the provision of a cooling apparatus which comprises a thermal conductor, at least one air-cooled heat sink, at least one thermoelectric device, and a controller. The thermal conductor facilitates cooling a heat-dissipating component(s) disposed within an enclosure, with the enclosure comprising an air inlet side through which an airflow ingresses into the enclosure. The thermal conductor includes a first conductor portion to couple to the heat-dissipating component(s) to conduct heat therefrom, and a second conductor portion disposed along the air inlet side of the enclosure, wherein when operational, the first conductor portion conducts heat, at least in part, from the heat-dissipating component(s) to the second conductor portion. The at least one air-cooled heat sink is coupled to the second conductor portion of the thermal conductor to facilitate transfer of heat from the thermal conductor to the airflow ingressing into the enclosure through the air inlet side thereof. The at least one thermoelectric device is coupled to at least one of the first conductor portion or the second conductor portion of the thermal conductor to selectively provide active auxiliary cooling to the thermal conductor, and the controller controls operation of the at least one thermoelectric device, and operates the cooling apparatus in one of an active cooling mode, where the at least one thermoelectric device is active, and a passive cooling mode, where the at least one thermoelectric device is inactive.

In another aspect, a cooled electronic system is provided which includes an electronics enclosure, multiple heat-dissipating components, and a cooling apparatus. The electronics enclosure includes an air inlet side through which an airflow ingresses into the electronics enclosure, and the multiple heat-dissipating components are disposed within the electronics enclosure. The cooling apparatus includes a thermal conductor, at least one air-cooled heat sink, at least one thermoelectric device, and a controller. The thermal conductor is coupled to one or more heat-dissipating components of the multiple heat-dissipating components, and includes a first conductor portion coupled to the one or more heat-dissipating components to conduct heat therefrom, and a second conductor portion positioned along the air inlet side of the electronics enclosure. The first conductor portion transfers heat, at least in part, from the one or more heat-dissipating components to the second conductor portion. The at least one air-cooled heat sink is coupled to the second conductor portion of the thermal conductor along the air inlet side of the electronics enclosure to facilitate transfer of heat from the second conductor portion to the airflow ingressing into the electronics enclosure. The at least one thermoelectric device is coupled to at least one of the first conductor portion or the second conductor portion of the thermal conductor to selectively provide active auxiliary cooling to the thermal conductor, and the controller controls operation of the at least one thermoelectric device and selectively switches operation of the cooling apparatus between an active cooling mode, where the at least one thermoelectric device is active, and a passive cooling mode, where the at least one thermoelectric device is inactive.

In a further aspect, a method is provided which includes: providing a cooling apparatus for cooling a heat-dissipating component(s) within an electronics enclosure, the electronics enclosure comprising an air inlet side through which an airflow ingresses into the electronics enclosure. The providing of the cooling apparatus includes: providing a thermal conductor to couple to the heat-dissipating component(s) within the electronics enclosure, the thermal conductor including: a first conductor portion to couple to the heat-dissipating component(s) to conduct heat therefrom; and a second conductor portion to position along the air inlet side of the electronics enclosure, wherein in operation, the first conductor portion transfers heat, at least in part, from the heat-dissipating component(s) to the second conductor portion; coupling at least one air-cooled heat sink to the second conductor portion of the thermal conductor to facilitate transfer of heat from the second conductor portion to the airflow ingressing into the electronics enclosure; providing at least one thermoelectric device coupled to at least one of the first conductor portion or the second conductor portion of the thermal conductor to selectively provide active auxiliary cooling to the thermal conductor; and providing a controller to control operation of the at least one thermoelectric device and selectively switch operation of the cooling apparatus between an active cooling mode, where the at least one thermoelectric device is active, and a passive cooling mode, where the at least one thermoelectric device is inactive.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

In a conventional air-cooled data center, multiple electronics racks may be disposed in one or more rows, with the data center housing several hundred, or even several thousand, microprocessors within the electronics racks. Note that "electronics rack", "rack", "information technology (IT) rack", etc., may be used interchangeably herein, and unless otherwise specified, include any housing, frame, support, structure, compartment, etc., having one or more heat-generating components of a computer system, electronic system, IT system, etc. Note also that reference is made below to the drawings, which may not be drawn to scale for ease of understanding of the various aspects of the present invention, with the same reference numbers used throughout different figures designating the same or similar components.

Figure 1:
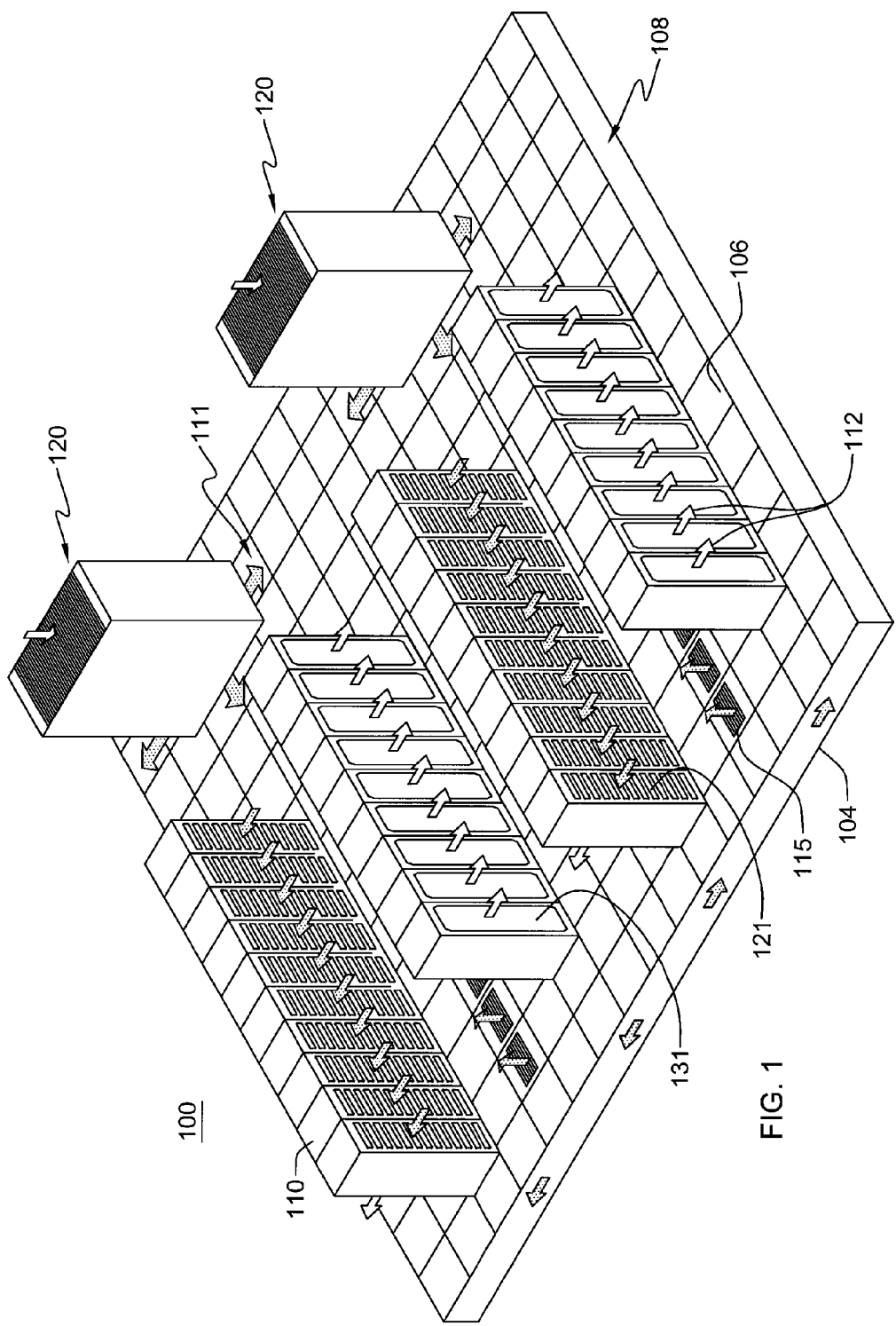
FIG. 1 depicts one embodiment of a conventional raised floor layout of an air-cooled data center.

FIG. 1 depicts one embodiment of a data center 100, which in one example, is a raised floor layout of an air-cooled computer installation or data center 100. Data center 100 includes electronics (or information technology (IT)) racks 110 disposed in one or more rows on a raised floor 106 of data center 100. One or more computer room air-handling units (CRAHs) 120 (also referred to as computer room air-conditioners (CRACs)) take in hot air (for example, through one or more air inlet vents in the top of the CRAHs) and exhaust cooled air into a sub-floor plenum 108 below raised floor 106. Hot airflow through data center 100 is depicted by light arrows 112, and chilled airflow through data center 100 is indicated by stippled arrows 111.

In FIG. 1, electronics racks 110 employ a front-to-back cooling approach. Namely, according to this approach, cooled air 111 is drawn in through a front or air-inlet side 121 of each rack, and hot air 112 is exhausted from a back or air-outlet side 131 of each rack. The cooled air drawn into the front of the rack is supplied to air inlets of the electronic components (e.g., servers) disposed within the IT racks. Space between raised floor 106 and a sub-floor 104 defines the sub-floor plenum 108. Sub-floor plenum 108 serves as a conduit to transport, for example, cooled air 111 from the air-conditioning units 120 to the electronics racks 110. In one embodiment, electronics racks 110 are arranged in a hot aisle/cold aisle configuration, with their air-inlet sides and air-outlet sides disposed in alternating directions, as illustrated in FIG. 1. Cooled air 111 is provided through one or more perforated floor tiles 115 in raised floor 106 from sub-floor plenum 108 into the cold aisles of the data center. The cooled air 111 is then drawn into electronics rack 110, via their inlets, and subsequently exhausted into the data center via one or more air outlets of the individual electronics racks into the hot aisles of the data center.

Figure 2A:
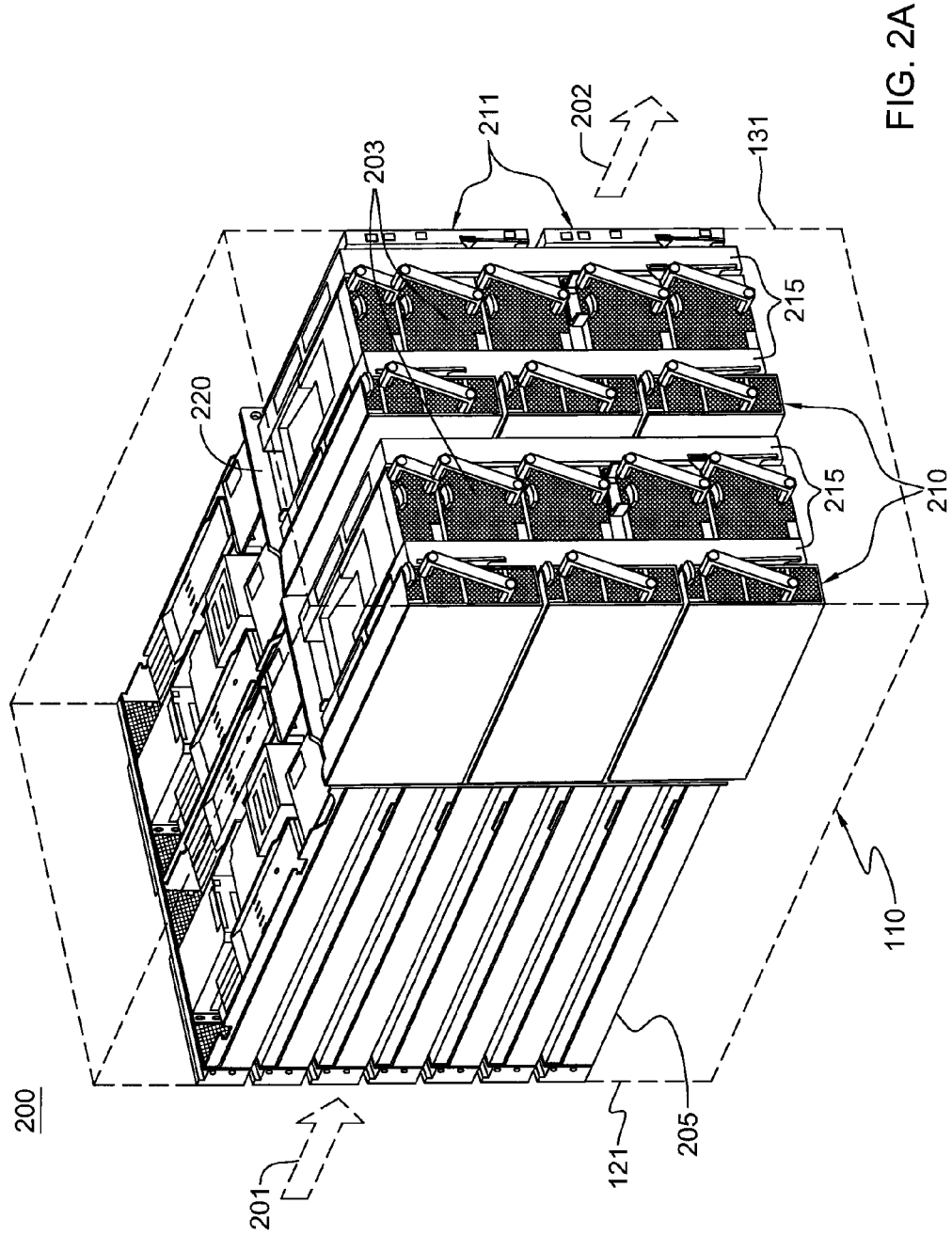
FIG. 2A depicts one embodiment of a cooled electronic system with multiple subsystem enclosures comprising one or more heat-dissipating components to be cooled, in accordance with one or more aspects of the present invention.

FIG. 2A depicts by way of example one embodiment of a cooled electronic system, generally denoted 200, which may reside, for instance, within an electronics (or IT) rack 110 within a data center, such as described above in connection with FIG. 1. In the embodiment depicted, cooled electronic system 200 includes a plurality of electronic subsystems, such as server drawers, input/output (I/O) cards, power supplies, etc., to be cooled by an ingressing cool airflow 201 at the air inlet side 121 of the electronics rack 110, with heated airflow 202 exhausting out the air outlet side 131. In the illustrated embodiment, multiple air-moving devices 203 are provided at the air outlet side of the cooled electronic system 200 to facilitate airflow through the individual electronic subsystems. Multiple air-moving devices 203 may be similar devices of the same or different sizes, such as 80 mm or 40 mm fan packs. By way of example, cooled electronic system 200 includes multiple server drawers 205, which operatively dock to one side of a midplane 220, with the other side of midplane 220 coupling, by way of example, multiple power supplies 210, multiple air-moving devices 203 with associated logic cards, as well as input/output (I/O) cards 215, such as scalable switch elements, and control cards 211. In one or more implementations, the various electronic subsystems illustrated in FIG. 2A may slide into electronics rack 110 from air inlet side 121, as in the case of server drawers 205, or the air outlet side 131, as is the case with air-moving devices 203, power supplies 210, control cards 211, and I/O cards 215, and when operational, are electrically connected and/or communicate via midplane 220.

Figure 2B:
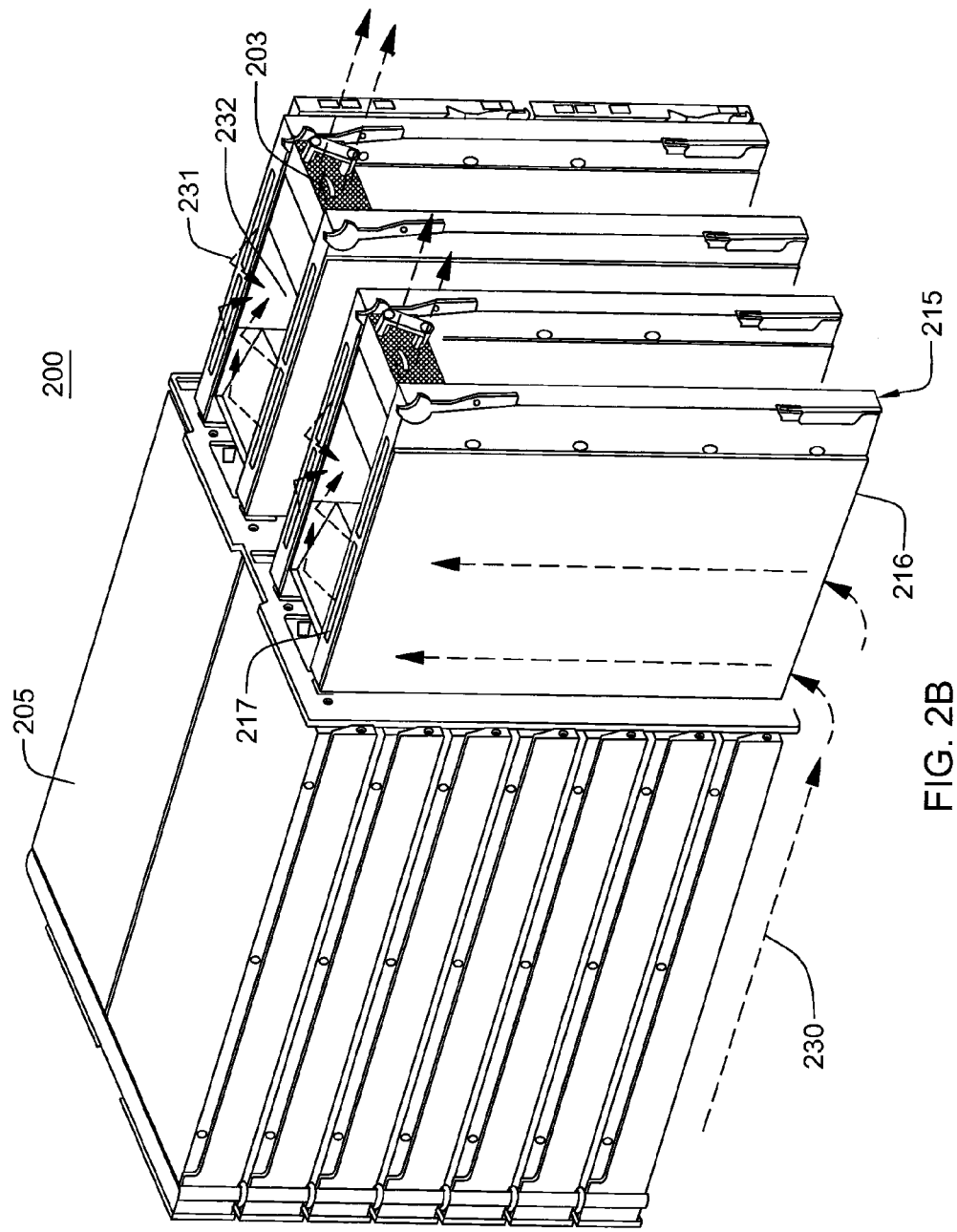
FIG. 2B depicts the cooled electronic system of FIG. 2A, with certain subsystems removed to illustrate airflow through selected electronics enclosures of the cooled electronic system, in accordance with one or more aspects of the present invention.

FIG. 2B depicts cooled electronic system 200 of FIG. 2A, with the midplane, power supplies, and most of the air-moving devices removed in order to illustrate a cooling airflow 230 into and through selected electronics enclosures, which in the depicted example, comprise the I/O cards 215, or scalable switch elements, for the multiple server drawers 205. As depicted, in one or more implementations, cooling airflow 230 passing through the electronics rack, for instance, via one or more air ducts (not shown) beneath sever drawers 205, enters an air inlet side 216 of the electronics enclosures housing the I/O cards 215, and exits air outlet sides 217 thereof as heated exhaust air 231. This heated exhaust air 231 is drawn into respective commoning air plenums 232 and exhausted (in this example) via air-moving devices 203 disposed near air outlet sides 217 of the electronics enclosures containing I/O cards 215. Note that in the depicted embodiment, each air-moving device 203 draws exhaust airflow 231 exiting from the electronic subsystem enclosures on either side of the air-moving device.

Figure 3:
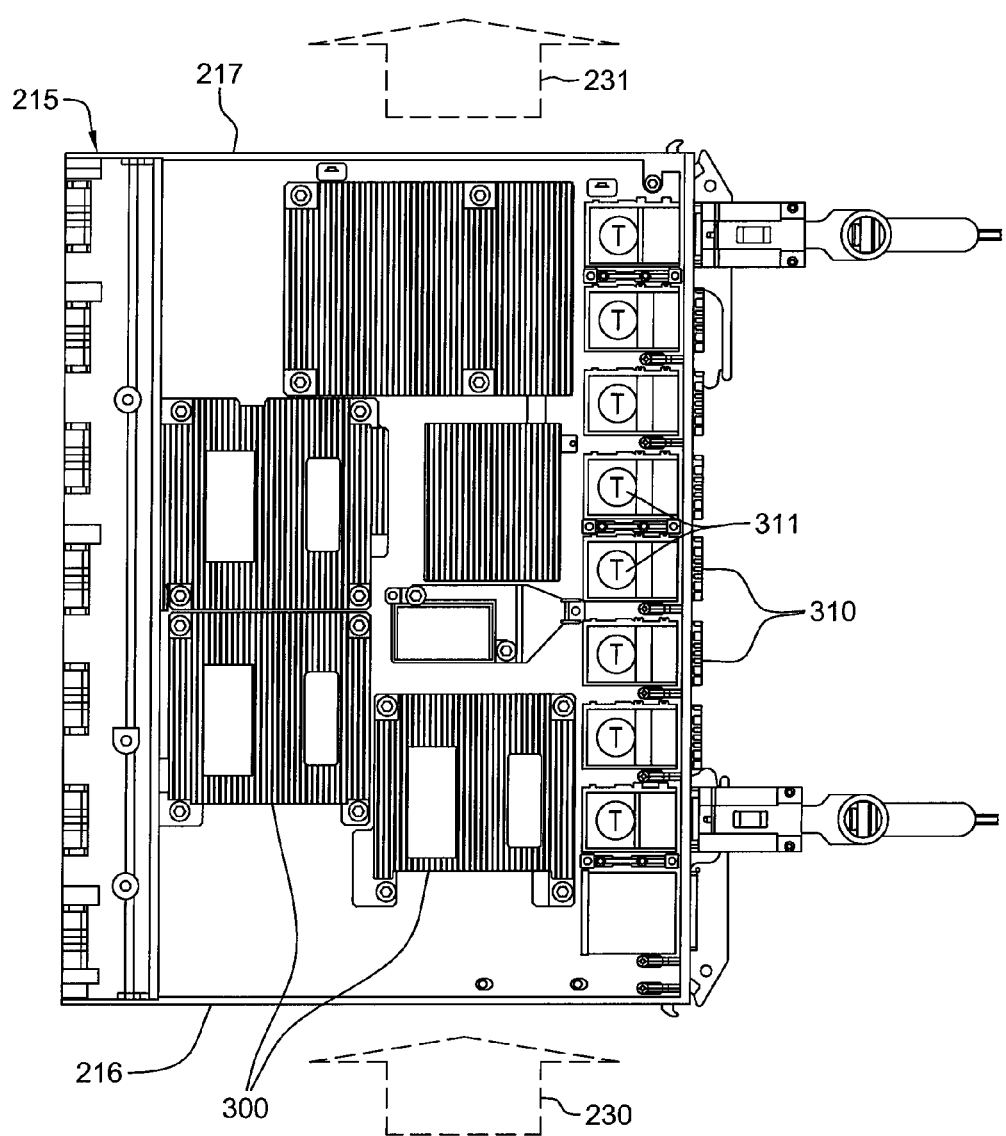
FIG. 3 is a plan view of one embodiment of an electronic subsystem layout, such as an input/output card layout, illustrating multiple connectors or heat-dissipating components to be cooled via a cooling apparatus, in accordance with one or more aspects of the present invention.

FIG. 3 depicts one embodiment of a component layout for an I/O card 215, or a scalable switch element, by way of example only. As noted, airflow 230 enters air inlet side 216 of the electronics enclosure and exits air outlet side 217 as heated exhaust air 231. In certain embodiments, the heated exhaust air 231 is drawn into an adjacent commoning plenum and exhausted via a respective air-moving device (see FIG. 2B) out the air outlet side of the electronics rack housing the cooled electronics system. One or more heat-generating components within the airflow path through the electronics enclosure may have associated therewith air-cooled heat sinks 300, which in one or more embodiments may overlie the respective component(s) to be cooled. In this input/output card example, a plurality of connectors 310, such as active optical connectors, may be located along one side of the electronic subsystem layout, with the one side in this example to be disposed at the hot air aisle of the data center when the input/output card is operatively docked within the electronics rack at the air outlet side thereof. In one or more embodiments, each connector 310 has associated therewith a temperature sensor (T) 311 to facilitate monitoring temperature of the connector 310. Each connector dissipates heat, and due to their function, the connectors are necessarily located along the edge of the I/O card adjacent to the hot air aisle of the data center. This configuration is advantageous for cabling and overall system interconnection, since communication cables coupled to the connectors can readily exit the electronics rack at the hot air aisle. However, the configuration is also disadvantageous for cooling connectors 310, since the connectors are not in the main path of airflow 230 through the electronics enclosure. One potential solution would be to provide air exhaust openings in the electronics enclosure adjacent to connectors 310 to allow additional airflow to pass over the connectors 310. However, in the configuration of FIGS. 2A & 2B, the air-moving device 203 is disposed downstream of the enclosure, and draws exhaust air through the electronics enclosure. Thus, any opening in the wall along which the connectors are arrayed at the hot air aisle would disadvantageously allow hot air to be drawn into the electronics enclosure. Thus, an alternative cooling approach is needed.

A cooling structure and apparatus are provided herein for an electronics enclosure comprising multiple heat-generating components to be cooled. The multiple heat-generating components may include multiple electronic or optoelectronic components, such as optical connectors containing electronics which dissipate heat, as with the example described above in connection with FIGS. 2A-3. The cooling apparatus may comprise a thermal conductor configured with a first portion for coupling to the one or more heat-dissipating components to conduct heat therefrom, and a second conductor portion for positioning along, for instance, the air inlet side of the electronics enclosure, wherein the first conductor portion conducts heat, at least partially, from the heat-dissipating component(s) to the second conductor portion. In one or more embodiments, the cooling apparatus may further include at least one air-cooled heat sink coupled to the second conductor portion of the thermal conductor along the air inlet side of the electronics enclosure to facilitate transfer of heat from the second conductor portion to the airflow ingressing into the enclosure, and at least one thermoelectric device coupled to at least one of the first conductor portion or the second conductor portion of the thermal conductor to selectively provide active auxiliary cooling to the thermal conductor. A controller controls operation of the at least one thermoelectric device, and selectively switches operation of the cooling apparatus between an active cooling mode, where the at least one thermoelectric device is active, and a passive cooling mode, where the at least one thermoelectric device is inactive.

In one or more implementations, the cooling apparatus comprises multiple air-cooled heat sinks, with a first air-cooled heat sink and a second air-cooled heat sink being located at opposite sides of the second conductor portion of the thermal conductor along the air inlet side of the enclosure. In certain implementations, the opposite sides of the second conductor portion and the thermal conductor include a first side and a second side, and the at least one thermoelectric device is disposed between the first side of the second conductor portion and the first air-cooled heat sink. The at least one thermoelectric device, when active, pumps heat from the first side of the second conductor portion to the first air-cooled heat sink to facilitate active cooling of the thermal conductor, and hence, active auxiliary cooling of the heat-dissipating component(s). The second air-cooled heat sink may be coupled to the second side of the second conductor portion of the thermal conductor.

In one or more embodiments, the first conductor portion and the second conductor portion of the thermal conductor extend in different directions, and the at least one thermoelectric device comprises multiple thermoelectric modules. The multiple thermoelectric modules may be coupled to the first side of the second conductor portion of the thermal conductor along the air inlet side of the electronics enclosure, and the controller may selectively separately control operation of each thermoelectric module of the multiple thermoelectric modules, for instance, in a preprogrammed manner. As an example, the controller may controllably provide auxiliary cooling to the thermal conductor by prioritizing activation of one or more thermoelectric modules of the multiple thermoelectric modules disposed closest to the first conductor portion of the thermal conductor when auxiliary cooling is desired. Further, temperature sensors associated with the second conductor portion may be provided to facilitate determining, for instance, a temperature differential between the first and second sides of the second conductor portion. The controller may use this temperature differential information to control operation of one or more of the thermoelectric modules of the multiple thermoelectric modules. In one or more implementations, an insulating layer may divide the second conductor portion into an upper conductor portion and a lower conductor portion. The insulating layer may extend within the second conductor portion, in one or more implementations, parallel with the first side and the second side of the second conductor portion, and inhibit transfer of heat from the second side to the first side when the cooling apparatus is in the active cooling mode.

In certain implementations, multiple air-cooled heat sinks may be provided, and the at least one thermoelectric device may include multiple thermoelectric modules. For instance, the multiple air-cooled heat sinks may include a first air-cooled heat sink and a second air-cooled heat sink, with the first air-cooled heat sink and the second air-cooled heat sink being disposed at opposite sides of the second conductor portion of the thermal conductor. The opposite sides of the second conductor portion of the thermal conductor may include a first side and a second side, and one or more thermoelectric modules of the multiple thermoelectric modules may be coupled to the first side of the second conductor portion, and one or more other thermoelectric modules of the multiple thermoelectric modules may be coupled to the second side of the second conductor portion. By way of example, the one or more thermoelectric modules and the one or more other thermoelectric modules may respectively couple to the first side and the second side of the second conductor portion of the thermal conductor closer to an end thereof, away from where the first conductor portion meets the second conductor portion within the thermal conductor.

By way of further example, the at least one thermoelectric device may include multiple thermoelectric modules coupled to the first conductor portion of the thermoelectric conductor. In such an implementation, the cooling apparatus may further include an auxiliary heat sink coupled to the multiple thermoelectric modules. The multiple thermoelectric modules may be disposed between the first conductor portion of the thermal conductor and the auxiliary heat sink.

Various thermal conductor embodiments may be used within the cooling apparatus. For instance, the thermal conductor may comprise a thermal conducting element that includes, for instance, a solid conduction layer comprising graphite, CVD diamond, copper, aluminum, etc. In one or more implementations, the thermal conducting element may also, or alternatively, include one or more embedded heat pipes or vapor chambers within the element to facilitate transfer of heat from, for instance, the first conductor portion to the second conductor portion. The one or more air-cooled heat sinks of the cooling apparatus may comprise a thermally conductive material, such as a metal (e.g., copper or aluminum), and may be, in one or more implementations, finned heat sink structures with bases bonded to, for instance, the thermal conductor, and/or the thermoelectric modules of the at least one thermoelectric device, depending upon the implementation.

Note that as used herein, "heat pipe" refers to a heat transfer device or element that combines the principles of both thermal conductivity and phase transition to effectively manage transfer of heat between two locations of the thermal conductor. In one or more implementations, the first conductor portion (or hot side) of the heat pipe may comprise a liquid in contact with thermally conductive solid surfaces of the thermal conductor. The liquid vaporizes by absorbing heat from the surfaces, and the vapor travels along the heat pipe to the cooler, second conductor portion of the thermal conductor, where it condenses back to a liquid, releasing the latent heat. The liquid then returns to the hot portion of the thermal conductor. By way of example, a vapor chamber may be a particular type of heat pipe, alternatively referred to as a flat heat pipe, which has the same primary components as a tubular heat pipe, such as a hermetically-sealed, hollow vessel, a working fluid, and a closed-loop capillary recirculation system.

Figure 4:
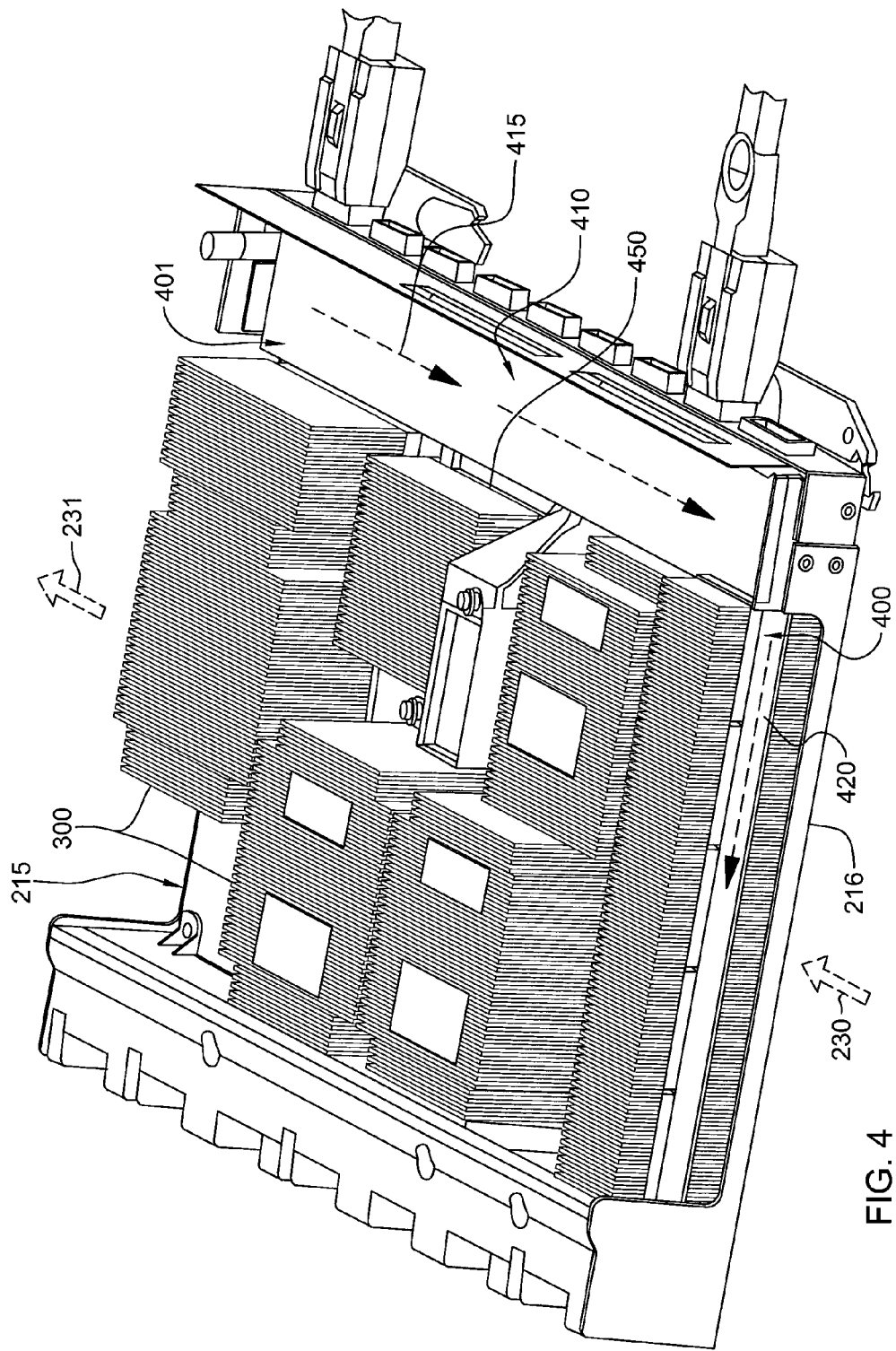
FIG. 4 depicts the electronic subsystem layout of FIG. 3, with one embodiment of a cooling apparatus shown overlying selected heat-dissipating components within the electronics enclosure, in accordance with one or more aspects of the present invention.

FIG. 4 depicts one embodiment of the electronics enclosure and I/O card 215 example of FIGS. 2A-3, with a cooling apparatus, generally denoted 400, provided overlying the multiple connectors 310 (FIG. 3), or heat-dissipating components, to be cooled. In the embodiment depicted, cooling apparatus 400 includes a thermal conductor 401 which comprises a first conductor portion 410 and a second conductor portion 420 formed, for instance, as an integrated or unitary structure, with the first and second portions 410, 420 extending in different directions, such that in one example, the thermal conductor 401 has an L-shape. First conductor portion 410 in this example overlies and couples to the multiple heat-dissipating components, for instance, the connectors 310 (FIG. 3), to facilitate conducting heat 415 therefrom. The second conductor portion 420 of thermal conductor 401 is positioned along the air inlet side 216 of the enclosure in the depicted embodiment, and is in thermal contact with (for instance, integrated with or thermally coupled to) first conductor portion 410 of thermal conductor 401. When operational, heat 415 is conducted from first conductor portion 410 to second conductor portion 420, where the heat is dissipated to the ingressing airflow via, for instance, the at least one air-cooled heat sink and the at least one thermoelectric device, as explained further below with reference to FIGS. 5A & 5B.

Figure 5A:
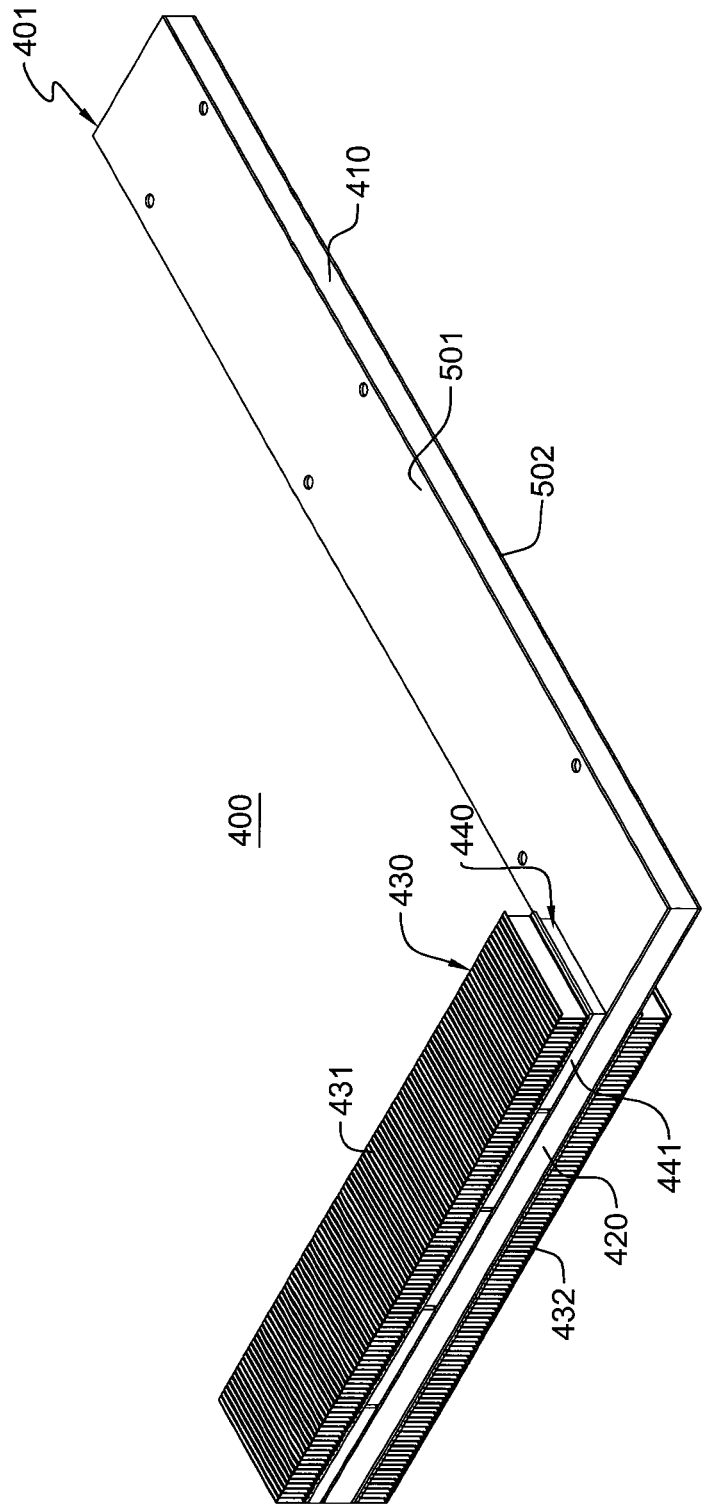
FIG. 5A is an enlarged perspective view of the cooling apparatus embodiment of FIG. 4, in accordance with one or more aspects of the present invention.
Figure 5B:
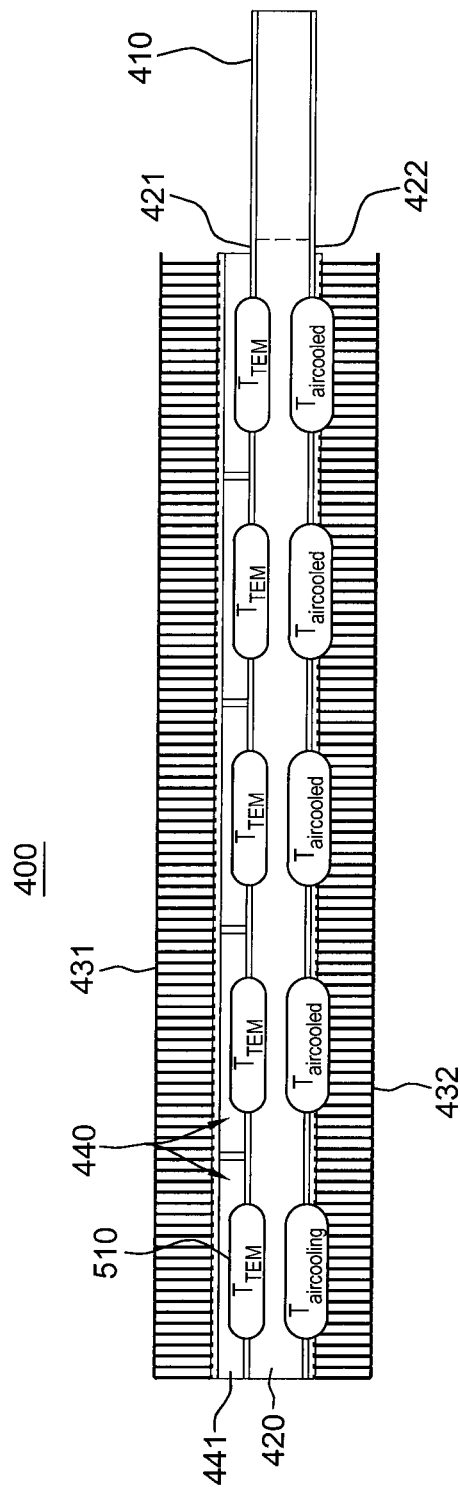
FIG. 5B is a further enlarged, end elevational view of the cooling apparatus of FIG. 5A, in accordance with one or more aspects of the present invention.

Referring collectively to FIGS. 5A & 5B, the cooling apparatus 400 embodiment of FIG. 4 is shown in greater detail. As noted, cooling apparatus 400 includes, for instance, thermal conductor 401, at least one air-cooled heat sink 430, and at least one thermoelectric device 440, along with a controller 450 (FIG. 4). In the embodiment depicted in FIGS. 5A & 5B, the cooling apparatus comprises multiple air-cooled heat sinks 431, 432, which are disposed at opposite sides of second conductor portion 420 of thermal conductor 401. Additionally, the at least one thermoelectric device 440 is shown to comprise multiple thermoelectric modules 441 positioned between first air-cooled heat sink 431 and a first side 421 of second conductor portion 420 of thermal conductor 401. As explained below, the multiple thermoelectric modules 441 may be individually controlled by the controller, with activation of one or more of the thermoelectric modules placing the cooling apparatus in an active cooling mode, and deactivation of all thermoelectric modules placing the cooling apparatus in a passive, air-cooled only, cooling mode. The thermal conductor 401, or thermal conducting element, may in part overlie the components to be cooled, and be attached to the electronic subsystem board using appropriate fasteners (not shown). For instance, the first conductor portion 410 may be thermally coupled via a thermal interface material, thermal interface pad, or be configured with a spring-loaded contact structure to ensure good coupling to the underlying heat-dissipating components, such as the connectors 310 (FIG. 3) in the example described above. Heat is conducted through the thermal conductor from the heat-dissipating components to the second conductor portion 420 at the air inlet side of the electronics enclosure. At the air inlet side of the electronics enclosure, the air-cooled heat sinks 431, 432 reject heat from the thermal conductor to the airflow ingressing into the electronics enclosure. Note that, since the second air-cooled heat sink 432 is directly coupled to a second side 422 of second conductor portion 420, at least a portion of the heat dissipated by the heat-dissipating components and conducted from the first conductor portion 410 along the thermal conductor, is dissipated directly to the airflow passing through the air inlet side of the enclosure. The air-cooled fins may be thermally and mechanically bonded to, for instance, a metal cladding of the thermal conductor 401, either metallurgically, with braze or solder, or via thermal interface material and fasteners. In the embodiment of FIGS. 5A & 5B, the thermal conductor 401 may comprise a graphite structure, a metal or other solid thermal conductor, such as copper or aluminum or Aluminum Silicon Carbide (by way of example). Additionally, or alternatively, one or more heat pipes may be embedded within the thermal conductor, or one or more vapor chambers. Upper and lower metal cladding 501, 502 may be provided over the thermal conducting layer of the thermal conductor 401, if desired.

In the depicted implementation, on one of the first side 421 or the second side 422 of second conductor portion 420, a thermal interface may be provided to a cold side of at least one thermoelectric device, shown in the illustrated embodiments comprising multiple thermoelectric modules 441 arranged in a row. The thermoelectric modules may be any of a variety of commercially available thermoelectric modules, including, for instance, thermoelectric modules available from Ferrotec, of Santa Clara, Calif. (USA), or thermoelectric modules available from Marlo Industries, Inc., of Dallas, Tex. (USA), by way of example only. Multiple temperature sensors 510 (FIG. 5B) may be provided along first side 421 and second side 422 of second conductor portion 420 for use in a control process such as described below with reference to FIG. 7. Responsive to temperatures sensed at the heat-dissipating components via, for instance, temperature sensors 311 (FIG. 3), the thermoelectric modules 441 may be supplied electrical current from the system to pump heat from the cold sides of the thermoelectric modules (TEMs) 441 to the hot sides, aiding in the cooling of the thermal conductor, and thus the heat-dissipating components coupled to the thermal conductor. In the embodiment depicted, the hot sides of the thermoelectric modules 441 are mechanically and thermally coupled to first air-cooled heat sink 431, through which heat dissipated by the thermoelectric modules, and heat pumped by the thermoelectric modules, is dissipated to the airflow ingressing into the electronics enclosure.

Figure 6:
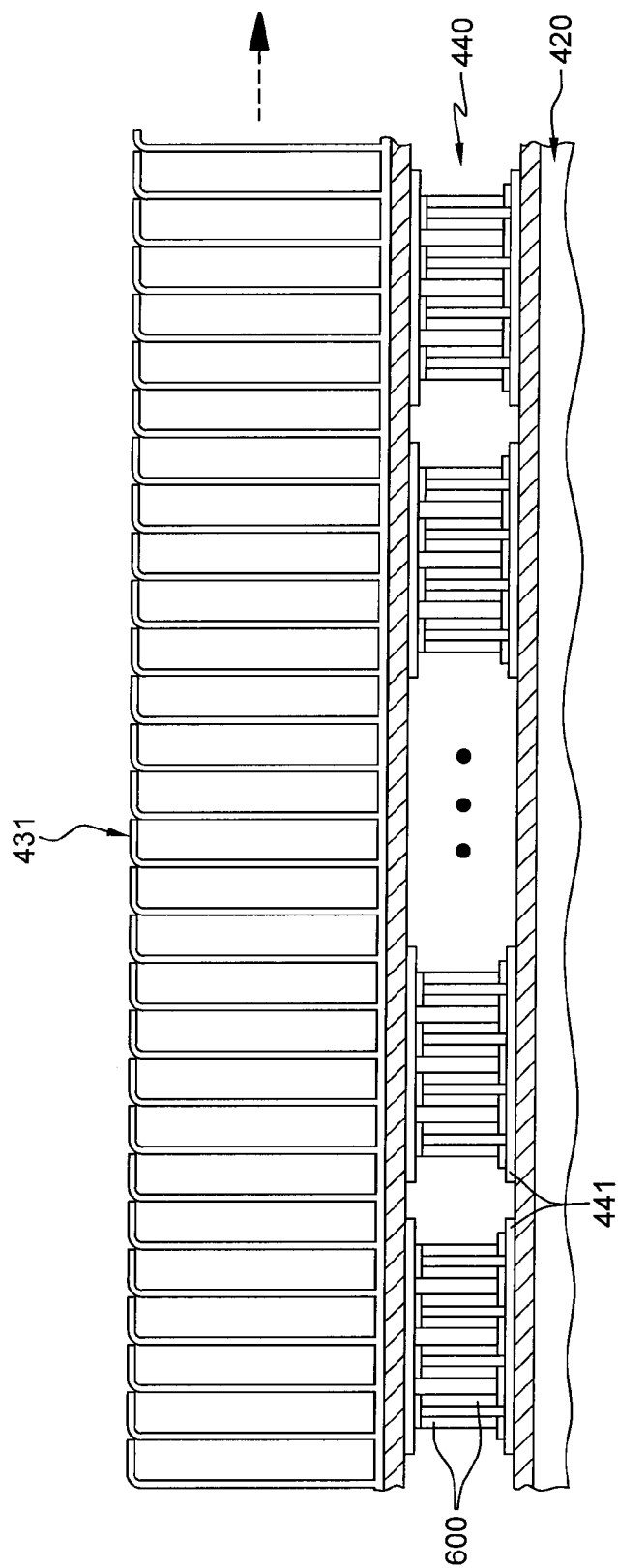
FIG. 6 is an enlarged, partial cross-sectional elevational view of one embodiment of a thermoelectric device for a cooling apparatus such as depicted in FIGS. 4-5B, in accordance with one or more aspects of the present invention.

FIG. 6 is a cross-sectional elevational view of one embodiment of a thermoelectric device 440 which comprises a row or an array of thermoelectric modules 441, each of which may comprise individual thermoelectric elements 600. In the example depicted, the thermoelectric device 440 is disposed between the second conductor portion 420 and an air-cooled heat sink 431, with a cold side of each thermoelectric module 441 being coupled to the second conductor portion 420, and a hot side of each thermoelectric module being coupled to the air-cooled heat sink 431.

The use of relatively large thermoelectric cooling elements is known. These elements operate electronically to produce a cooling effect. By passing a direct current through the legs of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to, for instance, a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

Note that the thermoelectric device may comprise any number of thermoelectric modules, including one or more modules, and is dependent (in part) on the size of the electronic modules, as well as the amount of heat to be transferred from the thermal conductor to the air-cooled heat sink.

The thermoelectric (TE) array may comprise a planar thermoelectric array with modules arranged in a row, a square, a rectangular array, etc. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

As noted, the controller 450 (FIG. 4) controls operation of the thermoelectric device(s) comprising the multiple thermoelectric modules, and selectively switches operation of the cooling apparatus between an active cooling mode, with one or more of the thermoelectric modules active, and a passive cooling mode, where the thermoelectric modules are inactive, or off. The controller may reside at a variety of locations within or external to the electronics enclosure containing the components to be cooled or the electronics rack containing the electronics enclosure. In addition, the controller may be implemented in a variety of manners. In one or more embodiments, the controller may be programmed or configured with a predefined process for determining whether and when to activate or deactivate a particular thermoelectric module of the thermoelectric device(s). As noted, in one or more implementations, temperature sensors are associated with the heat-dissipating component(s) (e.g., connector(s) ($T_{connector}$)) to be cooled, as well as with the first and second sides 421, 422 (FIGS. 5A & 5B) of the second conductor portion 420 of the thermal conductor below each thermoelectric module (i.e., $T_{TEM}$, $T_{aircooled}$).

Figure 7:
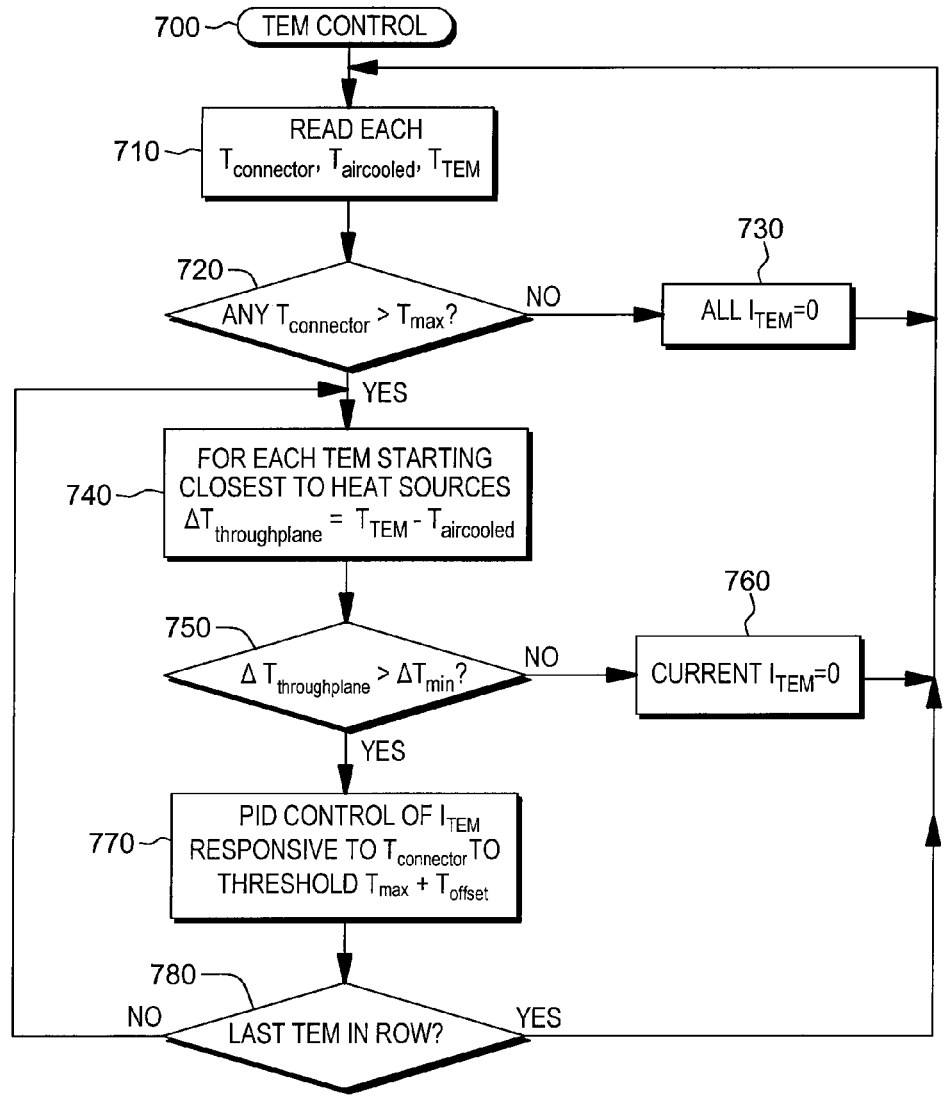
FIG. 7 is a flowchart of one embodiment of a process for controlling operation of the thermoelectric modules of the thermoelectric device(s) within a cooling apparatus such as depicted in FIGS. 4-6, in accordance with one or more aspects of the present invention.

FIG. 7 depicts one embodiment of a control process which may be implemented by the controller. This control process determines the appropriate amount of current flow to each thermoelectric module for a desired cooling effect. The thermoelectric module control 700 includes reading each temperature sensor $T_{connector}$, $T_{aircooled}$, $T_{TEM}$ 710 and then determining whether the temperature of any connector ($T_{connector}$) is above a specified maximum temperature $T_{max}$ 720. If "no", then all thermoelectric modules (TEMs) may remain off, with the current $I_{TEM}$=0 for each thermoelectric module 730. In this condition, the cooling apparatus is in an energy efficient, passive cooling mode, with the conducted heat dissipated to the airflow ingressing into the electronics enclosure through the air inlet side thereof via the one or more air-cooled heat sinks.

If a connector temperature ($T_{connector}$) is above the specified maximum temperature ($T_{max}$), then for each thermoelectric module using the associated $T_{TEM}$ and $T_{aircooled}$, starting with the thermoelectric module closest to the heat-dissipating component(s) to be cooled, that is, closest to the first conductor portion, processing determines the temperature change across the second conductor portion adjacent to that thermoelectric module using the associated $T_{TEM}$ and $T_{aircooled}$ ($\Delta T_{throughplane}$=$T_{TEM}$ $T_{aircooled}$) 740. Processing determines whether the $\Delta T_{throughplane}$ for the thermoelectric module closest to the heat-dissipating components is above a set $\Delta T_{min}$ 750. If "no", then the current to that thermoelectric module ($I_{TEM}$) is set to zero 760, deactivating or maintaining inactive that thermoelectric module. However, if the temperature change across the second conductor portion in the region of the thermoelectric module ($\Delta T_{throughplane}$) is above the defined minimum, then processing implements PID control of ITEM responsive to the $T_{connector}$ sensed temperature to a threshold $T_{max}$+$T_{offset}$ 770. Processing then determines whether the subject thermoelectric module is the last thermoelectric module in the thermoelectric device to be processed, for instance, the last thermoelectric module in a row of thermoelectric modules 780. If "no", then the process repeats for a next thermoelectric module in the row. Otherwise, the process returns to again read the connector temperature ($T_{connector}$), as well as the temperature sensors at the air-cooled side ($T_{aircooled}$) and thermoelectric module side ($T_{TEM}$) of the second conductor portion, and repeats the process.

Note that, in one or more embodiments, the process of FIG. 7 controls the thermoelectric current responsive to the temperature sensors. In general, as the temperature of the connectors exceeds a threshold, one or more thermoelectric modules are engaged, as long as the temperature of the conductor at the air-cooled fins side directly opposed to the thermoelectric module at issue does not equal or exceed the temperature of the conductor directly coupled to the thermoelectric module cold side. This prevents heat flow directly from the air-cooled fins through the conductor to the thermoelectric modules. In the embodiments described above, such an undesirable "short circuit" of heat flow could occur in the absence of processing such as depicted in FIG. 7 if the inlet air is relatively cool (e.g., 20° C.) and the connectors are operating at high utilization (e.g., 9 W for an active optical connector such as discussed herein, for a total of 81 W in a 9-connector array). The alternate embodiments depicted in FIGS. 8-10B provide, in part, alternate solutions to the "short circuit" effect of heat flow from one side to the other side of the second conductor portion.

Figure 8:
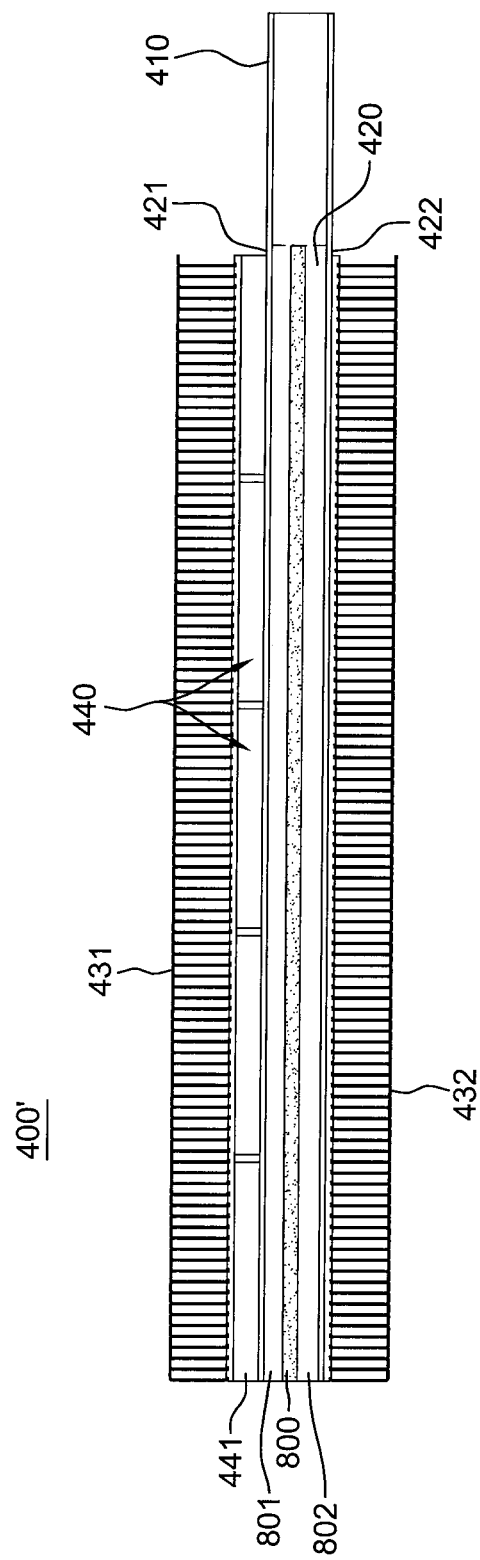
FIG. 8 depicts an alternate embodiment of a cooling apparatus such as depicted in FIGS. 4-6, for an electronic subsystem layout such as shown in FIG. 3, in accordance with one or more aspects of the present invention.

By way of example, FIG. 8 depicts a cooling apparatus 400' substantially identical to cooling apparatus 400 depicted in FIGS. 4-5B and described above. In the configuration of FIG. 8, an insulating layer 800 is provided within second conductor portion 420, dividing the second conductor portion into an upper conductor portion 801 and a lower conductor portion 802. In one or more embodiments, insulating layer 800 may extend substantially in parallel with first side 421 and second side 422 of second conductor portion 420, and be configured to inhibit transfer of heat from second side 422 to first side 421 when the cooling apparatus is in the active cooling mode, that is, when one or more of the thermoelectric modules 441 are provided with current. In one or more implementations, insulating layer 800 may comprise a plastic or other non-conductive material layer, or an air-gap, etc., formed within the second conductor portion of the thermal conductor to prevent heat flow directly from the air-cooled fin side of the conductor to the thermoelectric cooled side of the conductor. As noted, this configuration could advantageously be used to prevent or limit the thermoelectric modules from pumping heat conducted from the air-cooled fin side of the second conductor portion.

Figure 9:
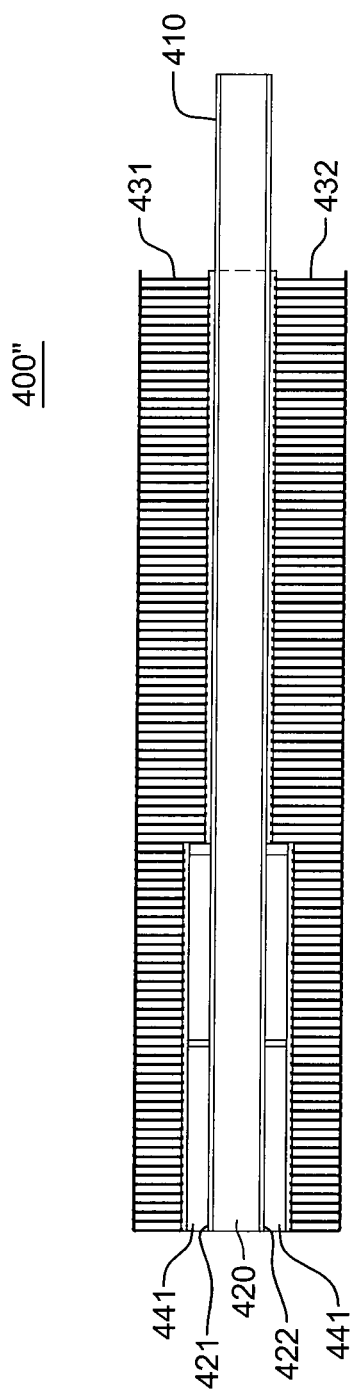
FIG. 9 depicts another embodiment of a cooling apparatus for cooling selected components within an electronics enclosure such as shown in FIG. 3, in accordance with one or more aspects of the present invention.

FIG. 9 depicts another embodiment of a cooling apparatus 400", in accordance with one or more aspects of the present invention. Cooling apparatus 400" is similar to cooling apparatus 400 described above in connection with FIGS. 4-5B, with the exception that thermoelectric modules 441 are provided on both sides of the second conductor portion 420. In particular, a first air-cooled heat sink 431 and second air-cooled heat sink 432 are provided coupled to opposite sides 421, 422 of second conductor portion 420 of the thermal conductor of the cooling apparatus 400". In addition, one or more thermoelectric modules 441 are coupled to first side 421 of second conductor portion 420, and one or more other thermoelectric modules 441 are coupled to second side 422 of thermal conductor portion 420 of the thermal conductor. As illustrated in FIG. 9, in one or more implementations, these thermoelectric modules 441 are provided adjacent to an end of second conductor portion 420, remote from where second conductor portion 420 meets or is in thermal contact with first conductor portion 410. As illustrated, in one or more embodiments, first air-cooled heat sink 431 overlies the thermoelectric modules coupled to first side 421 of second conductor portion 420, and second air-cooled heat sink 432 overlies and couples to the thermoelectric modules coupled to second side 421 of second conductor portion 420. In this configuration, the air-cooled heat sinks facilitate dissipating heat from the thermoelectric modules, as well as heat from the heat-dissipating components. In the embodiment depicted, each cold side of the thermoelectric modules is coupled to the second conductor portion, and the respective air-cooled heat sinks couple to the thermoelectric module hot sides, as well as to the second conductor portion itself. In this configuration, parallel heat paths are provided, with the first path being through the second conductor portion to the air-cooled fins directly attached to the conductor via a thermal interface material, and the second path being through the thermoelectric module cold sides, where heat is pumped through the thermoelectric modules, via an appropriate thermal interface, to another thermal interface, and then, to the air-cooled fins on the hot sides of the thermoelectric modules.

Figure 10A:
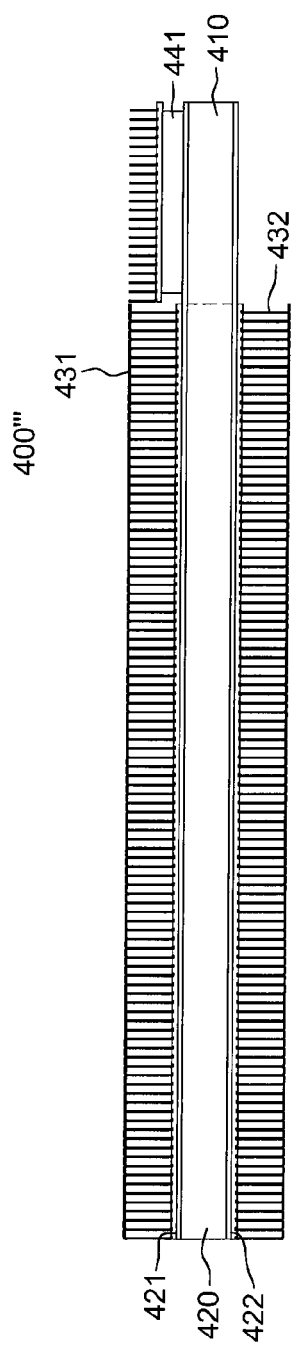
FIG. 10A is an end elevational view of a further embodiment of a cooling apparatus for cooling selected components within an electronics enclosure such as shown in FIG. 3, in accordance with one or more aspects of the present invention.
Figure 10B:
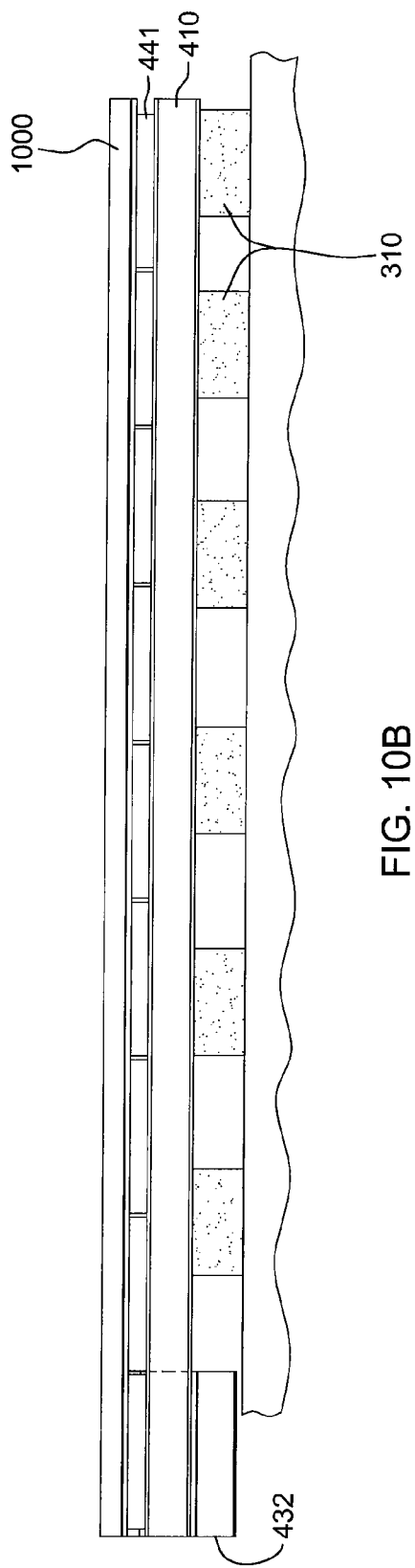
FIG. 10B is a side elevational view of the cooling apparatus of FIG. 10A, in accordance with one or more aspects of the present invention.

FIGS. 10A & 10B depict another embodiment of a cooling apparatus 400''', in accordance with one or more aspects of the present invention. This cooling apparatus is again similar to that described above in connection with FIGS. 4-5B, but with the thermoelectric modules 441 of the thermoelectric devices positioned along the first conductor portion 410 of thermal conductor 401, rather than the second conductor portion 420. In this configuration, the first and second air-cooled heat sinks 431, 432 are respectively coupled to the first and second sides 421, 422 of the second conductor portion at the air inlet side of the electronics enclosure comprising the heat-dissipating components to be cooled, with the first conductor portion 410 extending, for instance, orthogonal from the second conductor portion along one side of the enclosure, over the heat-dissipating components to be cooled, such as is the case with the above-described embodiment of FIG. 4. The multiple thermoelectric modules 441 are disposed with their cold side coupled to the upper surface of first conductor portion 410, which has its lower surface thermally coupled to the components to be cooled. The hot sides of the thermoelectric modules 441 are coupled to an auxiliary heat sink 1000.

In one or more embodiments, auxiliary heat sink 1000 may comprise a finned or pinned heat sink, with a plurality of fins or a plurality of pins extending from a base thermally-conductive structure. As illustrated in the example, the auxiliary heat sink 1000 may be shorter in height than the first and second air-cooled heat sinks, in order to accommodate the thermoelectric modules 441 between auxiliary heat sink 1000 and first conductor portion 410. Parallel heat flow paths are again provided in the embodiment of FIGS. 10A & 10B, with a first path being defined by heat pumped through the thermal conductor by the thermoelectric modules 441 to the auxiliary air-cooled heat sink 1000 coupled to the hot sides of the thermoelectric modules, and the second path being towards the distal end of the second conductor portion 420 to the first and second air-cooled heat sinks 431, 432 coupled to opposite sides of the second conductor portion at the air-inlet side of the electronics enclosure.

Figure 11:
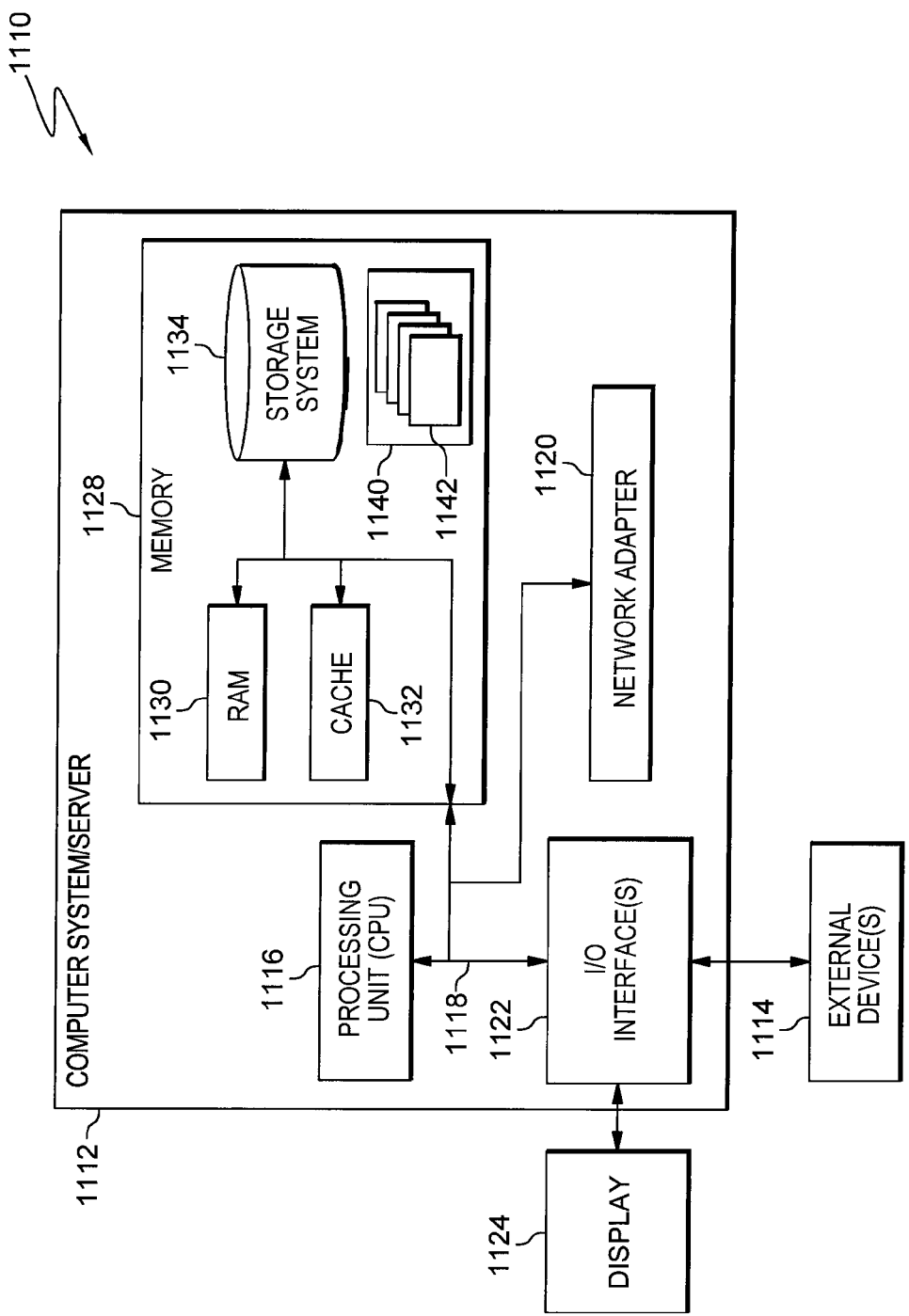
FIG. 11 depicts one embodiment of a data processing system to implement one or more aspects of the present invention.

Referring now to FIG. 11, a schematic of an example of a data processing system 1110 is shown. Data processing system 1110 is only one example of a suitable data processing system and is not intended to suggest any limitation as to the scope of use or functionality of embodiments of the invention described herein. Regardless, data processing system 1110 is capable of being implemented and/or performing any of the functionality set forth herein above, such as the cooling apparatus controller functionality discussed.

In data processing system 1110 there is a computer system/server 1112, which is operational with numerous other general purpose or special purpose computing system environments or configurations. Examples of well-known computing systems, environments, and/or configurations that may be suitable for use with computer system/server 1112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1112 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1112 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 1112 in data processing system 1110 is shown in the form of a general-purpose computing device. The components of computer system/server 1112 may include, but are not limited to, one or more processors or processing units 1116, a system memory 1128, and a bus 1118 that couples various system components including system memory 1128 to processor 1116.

Bus 1118 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), Micro Channel Architecture (MCA), Enhanced ISA (EISA), Video Electronics Standards Association (VESA), and Peripheral Component Interconnect (PCI).

Computer system/server 1112 typically includes a variety of computer system readable media. Such media may be any available media that is accessible by computer system/server 1112, and it includes both volatile and non-volatile media, removable and non-removable media.

System memory 1128 can include computer system readable media in the form of volatile memory, such as random access memory (RAM) 1130 and/or cache memory 1132. Computer system/server 1112 may further include other removable/non-removable, volatile/non-volatile computer system storage media. By way of example only, storage system 1134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1118 by one or more data media interfaces. As will be further depicted and described below, memory 1128 may include at least one program product having a set (e.g., at least one) of program modules that are configured to carry out the functions of embodiments of the invention.

Program/utility 1140, having a set (at least one) of program modules 1142, may be stored in memory 1128 by way of example, and not limitation, as well as an operating system, one or more application programs, other program modules, and program data. Each of the operating system, one or more application programs, other program modules, and program data or some combination thereof, may include an implementation of a networking environment. Program modules 1142 generally carry out the functions and/or methodologies of embodiments of the invention as described herein.

Computer system/server 1112 may also communicate with one or more external devices 1114 such as a keyboard, a pointing device, a display 1124, etc.; one or more devices that enable a user to interact with computer system/server 1112; and/or any devices (e.g., network card, modem, etc.) that enable computer system/server 1112 to communicate with one or more other computing devices. Such communication can occur via Input/Output (I/O) interfaces 1122. Still yet, computer system/server 1112 can communicate with one or more networks such as a local area network (LAN), a general wide area network (WAN), and/or a public network (e.g., the Internet) via network adapter 1120. As depicted, network adapter 1120 communicates with the other components of computer system/server 1112 via bus 1118. It should be understood that although not shown, other hardware and/or software components could be used in conjunction with computer system/server 1112. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
   a thermal conductor to facilitate cooling a heat-dissipating component(s) within an electronics enclosure, the electronics enclosure comprising an air inlet side through which an airflow ingresses into the electronics enclosure, the thermal conductor comprising:
      a first conductor portion to couple to the heat-dissipating component(s) to conduct heat therefrom; and
      a second conductor portion to position along the air inlet side of the enclosure, wherein when operational, the first conductor portion transfers heat, at least in part, from the heat-dissipating component(s) to the second conductor portion;
   at least one air-cooled heat sink coupled to the second conductor portion of the thermal conductor to facilitate transfer of heat from the second conductor portion to the airflow ingressing into the electronics enclosure through the air inlet side;
   at least one thermoelectric device coupled to at least one of the first conductor portion or the second conductor portion of the thermal conductor to selectively provide active auxiliary cooling to the thermal conductor; and
   a controller controlling operation of the at least one thermoelectric device and selectively switching operation of the cooling apparatus between an active cooling mode, where the at least one thermoelectric device is active, and a passive cooling mode, where the at least one thermoelectric device is inactive.

2. The cooling apparatus of claim 1, wherein the cooling apparatus comprises multiple air-cooled heat sinks, the at least one air-cooled heat sink being at least one air-cooled heat sink of the multiple air-cooled heat sinks, and wherein the multiple air-cooled heat sinks comprise a first air-cooled heat sink and a second air-cooled heat sink located at opposite sides of the second conductor portion of the thermal conductor at the air inlet side of the electronics enclosure.

3. The cooling apparatus of claim 2, wherein the opposite sides of the second conductor portion of the thermal conductor comprise a first side and a second side, the at least one thermoelectric device being located between the first side of the second conductor portion and the first air-cooled heat sink, and the at least one thermoelectric device comprising a cold side and a hot side when active, the cold side being coupled to the first side of the second conductor portion of the thermoelectric conductor, and the hot side being coupled to the first air-cooled heat sink, and wherein the second air-cooled heat sink is coupled to the second side of the second conductor portion of the thermal conductor.

4. The cooling apparatus of claim 3, wherein the first conductor portion and the second conductor portion of the thermal conductor extend in different directions, and wherein the at least one thermoelectric device comprises multiple thermoelectric modules, the multiple thermoelectric modules being coupled to the first side of the second conductor portion of the thermal conductor along the air inlet side of the electronics enclosure, and wherein the controller selectively, separately controls operation of each thermoelectric module of the multiple thermoelectric modules.

5. The cooling apparatus of claim 4, wherein the controller controllably provides auxiliary cooling to the thermal conductor by prioritizing activation of one or more thermoelectric modules of the multiple thermoelectric modules disposed closest to the first conductor portion of the thermal conductor when active auxiliary cooling is required.

6. The cooling apparatus of claim 4, further comprising temperature sensors associated with the second conductor portion to facilitate determining a temperature differential between the first and second sides thereof, the controller using the temperature differential in controlling operation of at least one thermoelectric module of the multiple thermoelectric modules.

7. The cooling apparatus of claim 4, further comprising an insulating layer within the second conductor portion and dividing the second conductor portion into an upper conductor portion and a lower conductor portion, the insulating layer inhibiting transfer of heat from the second side to the first side when the cooling apparatus is in the active cooling mode.

8. The cooling apparatus of claim 1, further comprising multiple air-cooled heat sinks, the at least one air-cooled heat sink being at least one air-cooled heat sink of the multiple air-cooled heat sinks, and the at least one thermoelectric device comprising multiple thermoelectric modules, and wherein the multiple air-cooled heat sinks comprise a first air-cooled heat sink and a second air-cooled heat sink, the first air-cooled heat sink and the second air-cooled heat sink being disposed at opposite sides of the second conductor portion of the thermal conductor, and wherein the opposite sides of the second conductor portion of the thermal conductor comprise a first side and a second side, and one or more thermoelectric modules of the multiple thermoelectric modules are coupled to the first side of the second conductor portion of the thermal conductor, and one or more other thermoelectric modules of the multiple thermoelectric modules are coupled to the second side of the second conductor portion of the thermal conductor.

9. The cooling apparatus of claim 8, wherein the one or more thermoelectric modules and the one or more other thermoelectric modules respectively couple to the first side and second side of the second conductor portion of the thermal conductor closer to an end thereof away from where the first conductor portion meets the second conductor portion within the thermal conductor.

10. The cooling apparatus of claim 1, wherein the at least one thermoelectric device comprises multiple thermoelectric modules coupled to the first conductor portion of the thermal conductor, and the cooling apparatus further comprises an auxiliary heat sink coupled to the multiple thermoelectric modules, the multiple thermoelectric modules being disposed between the first conductor portion of the thermal conductor and the auxiliary heat sink.

11. The cooling apparatus of claim 1, wherein the thermal conductor comprises at least one of a thermal conduction layer, a heat pipe, or a vapor chamber disposed within at least one of the first conductor portion or the second conductor portion.

12. The cooling apparatus of claim 1, wherein the thermal conductor comprises a thermal conduction layer, the thermal conduction layer comprising at least one of a graphite layer, a CVD diamond layer, a copper layer, or an aluminum layer.

13. A cooled electronic system comprising:
an electronics enclosure, the electronics enclosure including an air inlet side through which an airflow ingresses into the electronics enclosure;
multiple heat-dissipating components disposed within the electronics enclosure; and
a cooling apparatus, the cooling apparatus comprising:
a thermal conductor coupled to one or more heat-dissipating components of the multiple heat-dissipating components, the thermal conductor comprising:
a first conductor portion coupled to the one or more heat-dissipating components to conduct heat therefrom; and
a second conductor portion positioned along the air inlet side of the electronics enclosure, wherein the first conductor portion transfers heat, at least in part, from the one or more heat-dissipating components to the second conductor portion;
at least one air-cooled heat sink coupled to the second conductor portion of the thermal conductor along the air inlet side of the electronics enclosure to facilitate transfer of heat from the second conductor portion to the airflow ingressing into the electronics enclosure;
at least one thermoelectric device coupled to at least one of the first conductor portion or the second conductor portion of the thermal conductor to selectively provide active auxiliary cooling to the thermal conductor; and
a controller controlling operation of the at least one thermoelectric device and selectively switching operation of the cooling apparatus between an active cooling mode, where the at least one thermoelectric device is active, and a passive cooling mode, where the at least one thermoelectric device is inactive.

14. The cooled electronic system of claim 13, wherein the cooling apparatus comprises:
multiple air-cooled heat sinks, the at least one air-cooled heat sink being at least one air-cooled heat sink of the multiple air-cooled heat sinks, and the multiple air-cooled heat sinks comprising a first air-cooled heat sink and a second air-cooled heat sink located at opposite sides of the first conductor portion of the thermal conductor at the air inlet side of the electronics enclosure;
the opposite sides of the second conductor portion of the thermal conductor comprising a first side and a second side, the at least one thermoelectric device being located between the first side of the second conductor portion and the first air-cooled heat sink, and the at least one thermoelectric device comprising a cold side and a hot side when active, the cold side being coupled to the first side of the second conductor portion of the thermoelectric conductor, and the hot side being coupled to the first air-cooled heat sink, and wherein the second air-cooled heat sink is coupled to the second side of the second conductor portion of the thermal conductor; and
the first conductor portion and the second conductor portion of the thermal conductor extending in different directions, and the at least one thermoelectric device comprising multiple thermoelectric modules, the multiple thermoelectric modules being coupled to the first side of the second conductor portion of the thermal conductor along the air inlet side of the electronics enclosure, and the controller selectively separately controls operation of each thermoelectric module of the multiple thermoelectric modules.

15. The cooled electronic system of claim 14, wherein the controller controllably provides auxiliary cooling to the thermal conductor by prioritizing activation of one or more thermoelectric modules of the multiple thermoelectric modules disposed closest to the first conductor portion of the thermal conductor when active auxiliary cooling is required.

16. The cooled electronic system of claim 14, further comprising temperature sensors associated with the second conductor portion to facilitate determining a temperature differential between the first and second sides thereof, the controller using the temperature differential in controlling operation of at least one thermoelectric module of the multiple thermoelectric modules.

17. The cooled electronic system of claim 14, further comprising an insulating layer within the second conductor portion and dividing the second conductor portion into an upper conductor portion and a lower conductor portion, the insulating layer inhibiting transfer of heat from the second side to the first side when the cooling apparatus is in the active cooling mode.

18. The cooled electronic system of claim 13, further comprising multiple air-cooled beat sinks, the at least one air-cooled heat sink being at least one air-cooled heat sink of the multiple air-cooled heat sinks, and the at least one thermoelectric device comprising multiple thermoelectric modules, and wherein the multiple air-cooled heat sinks comprise a first air-cooled heat sink and a second air-cooled heat sink, the first air-cooled heat sink and the second air-cooled heat sink being disposed at opposite sides of the second conductor portion of the thermal conductor, and wherein the opposite sides of the second conductor portion of the thermal conductor comprise a first side and a second side, and one or more thermoelectric modules of the multiple thermoelectric modules are coupled to the first side of the second conductor portion of the thermal conductor, and one or more other thermoelectric modules of the multiple thermoelectric modules are coupled to the second side of the second conductor portion of the thermal conductor.

19. The cooled electronic system of claim 13, wherein the at least one thermoelectric device comprises multiple thermoelectric modules coupled to the first conductor portion of the thermal conductor, and the cooling apparatus further comprises an auxiliary heat sink coupled to the multiple thermoelectric modules, the multiple thermoelectric modules being disposed between the first conductor portion of the thermal conductor and the auxiliary heat sink.

* * * * *